(12) United States Patent
Doan et al.

(10) Patent No.: US 8,048,711 B2
(45) Date of Patent: Nov. 1, 2011

(54) METHOD FOR FORMING DEEP ISOLATION IN IMAGERS

(75) Inventors: Hung Q. Doan, Rochester, NY (US); Eric G. Stevens, Webster, NY (US)

(73) Assignee: Omnivision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/942,507

(22) Filed: Nov. 9, 2010

(65) Prior Publication Data
US 2011/0159635 A1 Jun. 30, 2011

Related U.S. Application Data

(60) Provisional application No. 61/335,025, filed on Dec. 30, 2009.

(51) Int. Cl.
*H01L 31/18* (2006.01)
(52) U.S. Cl. ................... 438/73; 257/E33.076
(58) Field of Classification Search .............. 438/76; 257/E33.076
See application file for complete search history.

(56) References Cited

U.S. PATENT DOCUMENTS

| | | | |
|---|---|---|---|
| 2004/0185597 A1* | 9/2004 | Merrill et al. | 438/70 |
| 2005/0087829 A1* | 4/2005 | Merrill et al. | 257/440 |
| 2007/0069260 A1 | 3/2007 | Stevens | |
| 2007/0114627 A1* | 5/2007 | Roy et al. | 257/431 |
| 2007/0131987 A1* | 6/2007 | Kim | 257/290 |
| 2008/0057612 A1* | 3/2008 | Doan et al. | 438/57 |
| 2009/0166786 A1 | 7/2009 | Shim | |
| 2010/0006969 A1* | 1/2010 | Park et al. | 257/446 |
| 2010/0102206 A1* | 4/2010 | Cazaux et al. | 250/208.1 |
| 2010/0327392 A1* | 12/2010 | McCarten et al. | 257/447 |
| 2010/0330728 A1* | 12/2010 | McCarten et al. | 438/70 |

FOREIGN PATENT DOCUMENTS

| | | |
|---|---|---|
| EP | 1 542 286 A2 | 6/2005 |
| WO | WO 02/27804 A2 | 4/2002 |

OTHER PUBLICATIONS

Chung-Wei Chang et al., "High Sensitivity of Dielectric Films Structure for Advanced CMOS Image Sensor Technology", 2007 International Image Sensor Workshop, pp. 207-210.
PCT International Search Report and the Written Opinion of the Int'l Searching Authority for PCT/US2010/060368, filed Dec. 15, 2010, mailed Apr. 29, 2011 (12 pgs.).

* cited by examiner

*Primary Examiner* — Thao P. Le
(74) *Attorney, Agent, or Firm* — Blakely Sokoloff Taylor & Zafman LLP

(57) ABSTRACT

An image sensor having an imaging area that includes a substrate layer and a plurality of pixels formed therein. Multiple pixels each include a photodetector formed in the substrate layer. Isolation layers are formed in the substrate layer by performing a series of implants of one or more dopants of a first conductivity type into the substrate layer. Each isolation layer implant is performed with a different energy than the other isolation layer implants in the series and each implant implants the one or more dopants into the entire imaging area. The photodetectors are formed in the substrate layer by performing a series of implants of one or more dopants of a second conductivity type into each pixel in the substrate layer. Each photodetector implant is performed with a different energy than the other photodetector implants in the series.

10 Claims, 8 Drawing Sheets

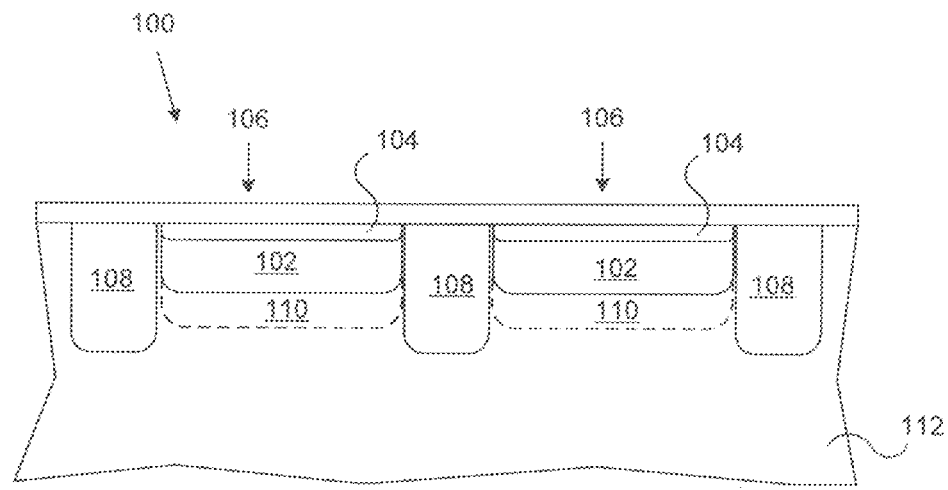
FIG. 1 - Prior Art
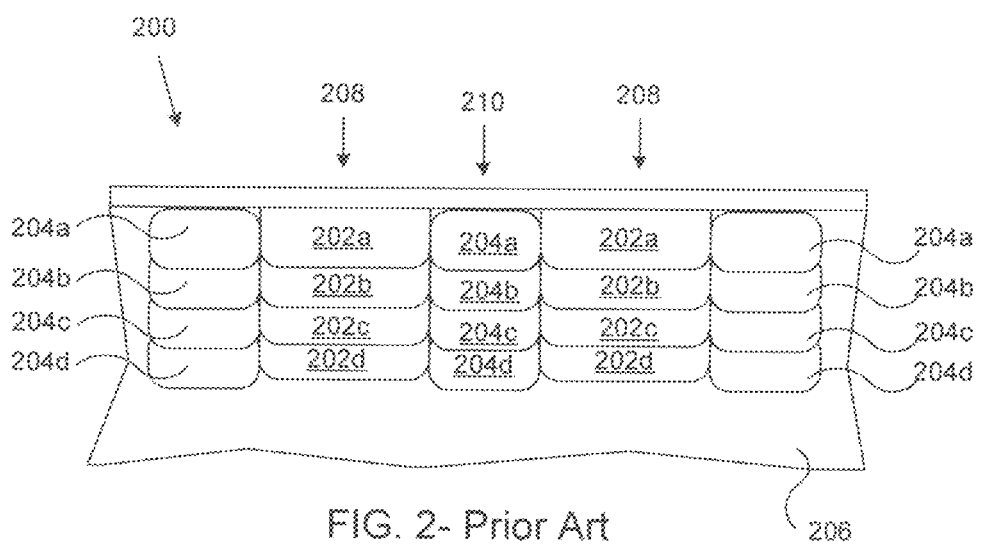
FIG. 2 - Prior Art

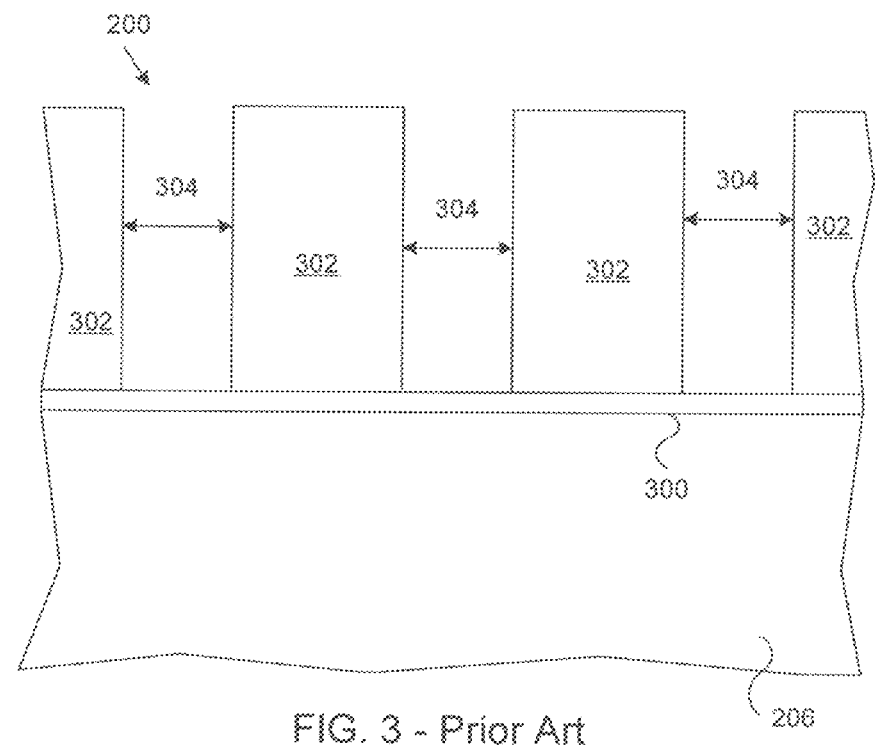
FIG. 3 - Prior Art
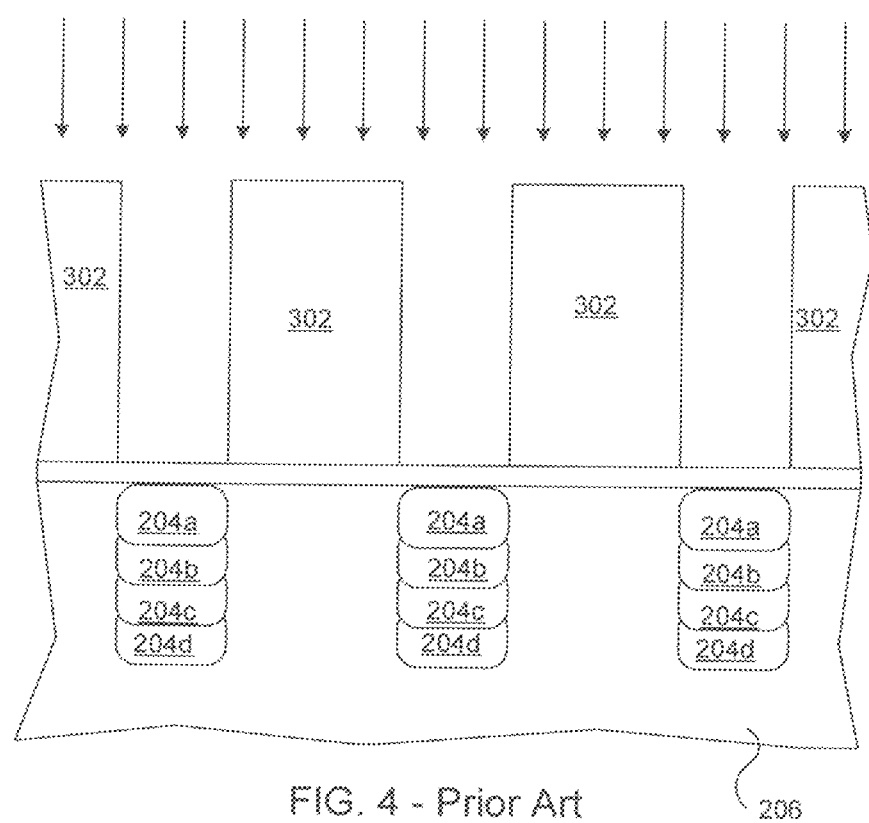
FIG. 4 - Prior Art

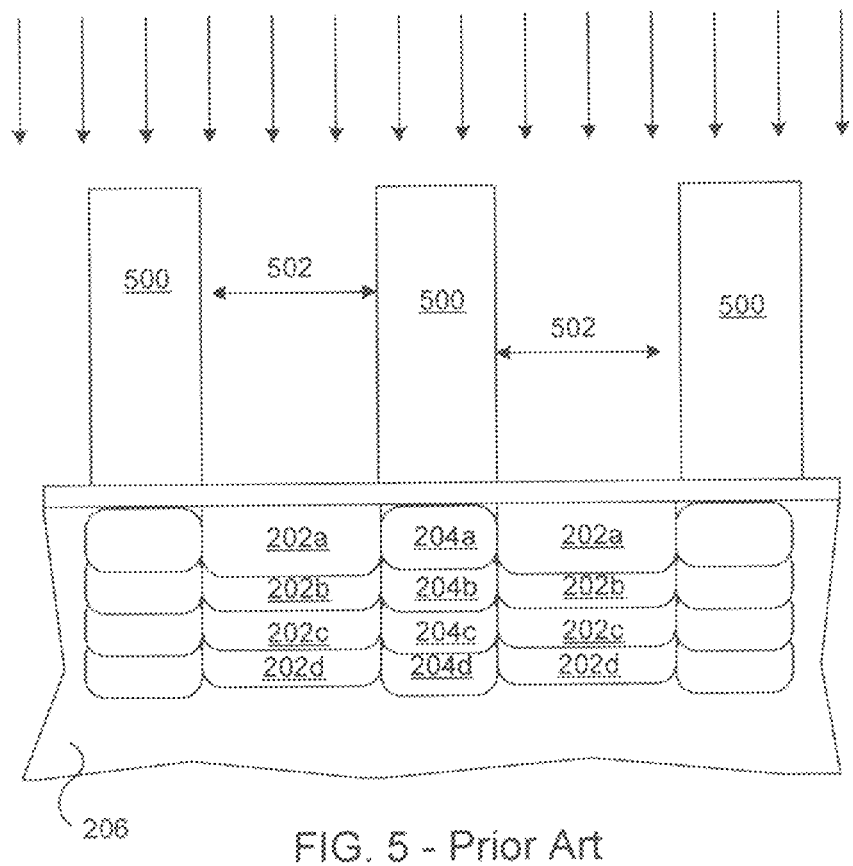
FIG. 5 - Prior Art
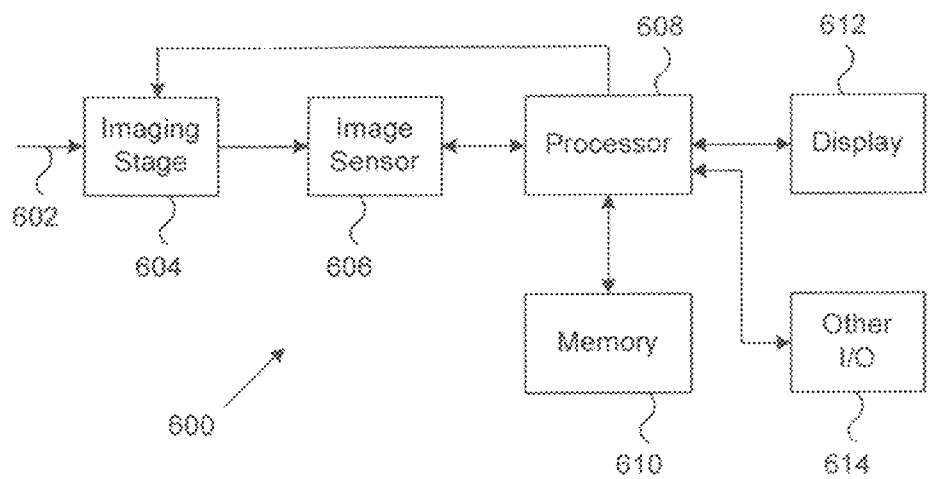
FIG. 6

METHOD FOR FORMING DEEP ISOLATION IN IMAGERS

CROSS-REFERENCE TO RELATED APPLICATIONS

This application claims the benefit of U.S. Provisional Application No. 61/335,025, filed on Dec. 30, 2009.

TECHNICAL FIELD

The present invention relates generally to image sensors, and more particularly to a method for forming photodetectors and isolation regions in image sensors. Still more particularly, the present invention relates to a method for forming deep photodetectors and deep isolation regions in image sensors.

BACKGROUND

A typical electronic image sensor contains an array of pixels. Each pixel contains a light sensitive region called a photodetector and an element to transfer or read out the charge collected in the photodetector. A photodetector is a simple PN or NP diode. An electron sensing photodetector generally includes a single n-type implant disposed inside a p-type substrate or a p-type well. Alternatively, a hole sensing photodetector has a p-type implant formed inside an n-type substrate or n-type well. In addition to the diode implant, a shallow pinning implant having an opposite conductivity type to that of the photodetector is placed at the substrate surface. The pinning layer pins the surface potential and reduces dark current generation from the surface states.

FIG. 1 is a cross-sectional view of a first image sensor in accordance with the prior art. Image sensor 100 includes diode implant 102 and pinning layer 104, which together form photodetectors 106. Isolation regions 108 are disposed between photodetectors 106 to electrically isolate each photodetector from adjacent photodetectors. Photo-generated charge carriers generated in the depletion depth 110 are collected and stored by the diode implant 102. Photo-generated charge carriers generated below depletion depth 110 under any given photodetector can diffuse to an adjacent photodetector, an undesirable effect known as electrical crosstalk.

One technique for reducing electrical cross talk is to push the depletion depth 110 deeper into substrate 112. This can be accomplished by adding a cascading or chain of light implants to the main diode implant. This technique is disclosed in United States Patent Application Publication US2007/0069260.

To effectively isolate the deep chain photodetector, the isolation regions also need a chain implant to form deeper isolation regions. This structure is shown in FIG. 2. Image sensor 200 includes diode implants 202a, 202b, 202c, 202d and isolation implants 204a, 204b, 204c, 204d formed in substrate 206. Collectively diode implants 202a, 202b, 202c, 202d form deep photodetectors 208 and isolation implants 204a, 204b, 204c, 204d form deep isolation regions 210.

FIGS. 3-5 are cross-sectional views of a method for forming the photodetectors and isolation regions shown in FIG. 2. Substrate 206 in FIG. 3 has been processed to the point where the next fabrication step is to perform the isolation region implants. Substrate 206 has a screening pad oxide 300 on the surface. A masking layer 302 is deposited over substrate 206 and patterned to provide openings 304 that expose the surface of pad oxide 300. The remaining masking layer 302 is positioned over the portions of the image sensor that will not be implanted. So the remaining masking layer 302 has a thickness that is sufficiently thick enough to block the implant, for example 2-3 microns.

Next, as shown in FIG. 4, a series of implants (represented by arrows) is performed to implant dopants into substrate 206 and form isolation implants 204a, 204b, 204c, 204d. Each implant is performed with a different energy so the dopants will reside at different depths within substrate 206. Additional fabrication steps are performed after the formation of the isolation implants, such as the formation of gates, but these steps are omitted from this description for the sake of simplicity and ease of understanding.

Masking layer 302 is then removed and a new masking layer 500 deposited over substrate 206 and patterned to form openings 502 (see FIG. 5). A series of implants (represented by arrows) is performed to implant dopants into substrate 206 and form diode implants 202a, 202b, 202c, 202d. Each implant is performed with a different energy so the dopants will reside at different depths within substrate 206. Masking layer 500 is then removed and the structure shown in FIG. 2 is obtained.

One design goal is to maximize the size of the photodetector region to maximize the pixel sensitivity and charge handling capability. Based on this, the size of the isolation regions is kept to a minimum. An isolation width between 0.3 to 0.4 microns is not uncommon for a pixel size as small as 1.4 microns. But patterning openings 304 (FIG. 3) to such a minimum feature size in a resist having a 2-4 micron thickness is difficult if not impossible. The isolation region dopants are usually implanted into the substrate at a 7 degree tilt. But with a minimum feature size of 0.3 to 0.4 microns, and with the high height to width aspect ratio, the implant angle needs to have a 0 degree tilt to allow the implant to be implanted into substrate 206. Otherwise, the implant will be masked by the shadowing effect, which can lead to implant channeling variation across substrate 206. Additionally, the resist profile tends to have an 80 degree side slope to the side. Since the masking layer is very thick, the openings at the top are much wider than the openings at the bottom of the resist 302 to obtain the desired minimum feature size.

SUMMARY

An image sensor includes an imaging area having a substrate layer with a plurality of pixels formed therein. Multiple pixels in the imaging area each include a photodetector formed in the substrate layer. Isolation layers are formed in the substrate layer by performing a series of implants of one or more dopants of a first conductivity type into the substrate layer. Each isolation layer implant is performed with a different energy than the other isolation layer implants in the series and each isolation layer implant implants the one or more dopants into the entire imaging area. Additionally, each isolation layer implant can optionally be performed with a different dopant dosage than the other isolation layer implants in the series.

The photodetectors are then formed in the substrate layer by performing a series of implants of one or more dopants of a second conductivity type into each pixel in the substrate layer. Each photodetector implant is performed with a different energy than the other photodetector implants in the series. Additionally, each photodetector implant can optionally be performed with a different dopant dosage than the other photodetector implants in the series.

BRIEF DESCRIPTION OF THE DRAWINGS

Embodiments of the invention are better understood with reference to the following drawings. The elements of the drawings are not necessarily to scale relative to each other.

FIG. 1 is a cross-sectional view of a first image sensor in accordance with the prior art;

FIG. 2 is a cross-sectional view of a second image sensor in accordance with the prior art;

FIGS. 3-5 are cross-sectional views of a method for forming the photodetectors and isolation regions shown in FIG. 2;

FIG. 6 is a block diagram of an image capture device in an embodiment in accordance with the invention;

DETAILED DESCRIPTION

Figure 7:
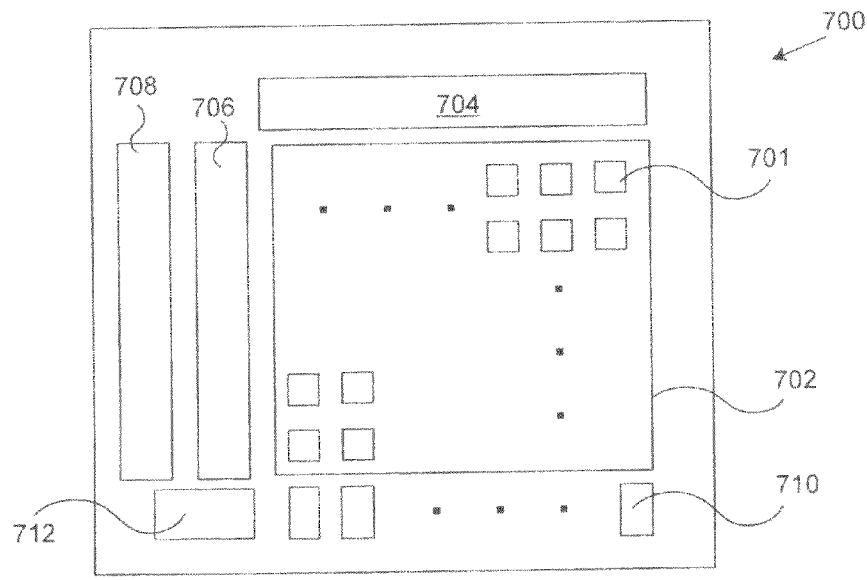
FIG. 7 is a simplified block diagram of a top view of an image sensor suitable for use as image sensor 606 in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected, or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the term "substrate layer" is to be understood as a semiconductor-based material including, but not limited to, silicon, silicon-on-insulator (SOI) technology, silicon-on-sapphire (SOS) technology, doped and undoped semiconductors, epitaxial layers formed on a semiconductor substrate, or well regions formed in a semiconductor substrate or epitaxial layer, and other semiconductor structures.

Referring to the drawings, like numbers indicate like parts throughout the views.

FIG. 6 is a simplified block diagram of an image capture device in an embodiment in accordance with the invention. Image capture device 600 is implemented as a digital camera in FIG. 6. Those skilled in the art will recognize that a digital camera is only one example of an image capture device that can utilize an image sensor incorporating the present invention. Other types of image capture devices, such as, for example, cell phone cameras, scanners, and digital video camcorders, can be used with the present invention.

In digital camera 600, light 602 from a subject scene is input to an imaging stage 604. Imaging stage 604 can include conventional elements such as a lens, a neutral density filter, an iris and a shutter. Light 602 is focused by imaging stage 604 to form an image on image sensor 606. Image sensor 606 captures one or more images by converting the incident light into electrical signals. Digital camera 600 further includes processor 608, memory 610, display 612, and one or more additional input/output (I/O) elements 614. Although shown as separate elements in the embodiment of FIG. 6, imaging stage 604 may be integrated with image sensor 606, and possibly one or more additional elements of digital camera 600, to form a camera module. For example, a processor or a memory may be integrated with image sensor 606 in a camera module in embodiments in accordance with the invention.

Processor 608 may be implemented, for example, as a microprocessor, a central processing unit (CPU), an application-specific integrated circuit (ASIC), a digital signal processor (DSP), or other processing device, or combinations of multiple such devices. Various elements of imaging stage 604 and image sensor 606 may be controlled by timing signals or other signals supplied from processor 608.

Memory 610 may be configured as any type of memory, such as, for example, random access memory (RAM), read-only memory (ROM), Flash memory, disk-based memory, removable memory, or other types of storage elements, in any combination. A given image captured by image sensor 606 may be stored by processor 608 in memory 610 and presented on display 612. Display 612 is typically an active matrix color liquid crystal display (LCD), although other types of displays may be used. The additional I/O elements 614 may include, for example, various on-screen controls, buttons or other user interfaces, network interfaces, or memory card interfaces.

It is to be appreciated that the digital camera shown in FIG. 6 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Referring now to FIG. 7, there is shown a simplified block diagram of a top view of an image sensor suitable for use as image sensor 606 in an embodiment in accordance with the invention. Image sensor 700 includes a number of pixels 701 typically arranged in rows and columns that form a pixel array 702. The pixel array 702 is defined herein as the imaging area. Image sensor 700 further includes column decoder 704, row decoder 706, digital logic 708, multiple analog or digital output circuits 710, and timing generator 712. Each column of pixels in pixel array 702 is electrically connected to an output circuit 710. Timing generator 712 generates the signals needed to read out signals from pixel array 702.

Image sensor 700 is implemented as an x-y addressable image sensor, such as, for example, a Complementary Metal Oxide Semiconductor (CMOS) image sensor, in an embodiment in accordance with the invention. Thus, column decoder 704, row decoder 706, digital logic 708, analog or digital output channels 710, and timing generator 712 are implemented as standard CMOS electronic circuits that are operatively connected to pixel array 702.

Functionality associated with the sampling and readout of pixel array 702 and the processing of corresponding image data may be implemented at least in part in the form of software that is stored in memory 610 (see FIG. 6) and executed by processor 608. Portions of the sampling and readout circuitry may be arranged external to image sensor 700, or formed integrally with pixel array 702, for example, on a common integrated circuit with photodetectors and other elements of the pixel array. Those skilled in the art will recognize that other peripheral circuitry configurations or architectures can be implemented in other embodiments in accordance with the invention.

Figure 8:
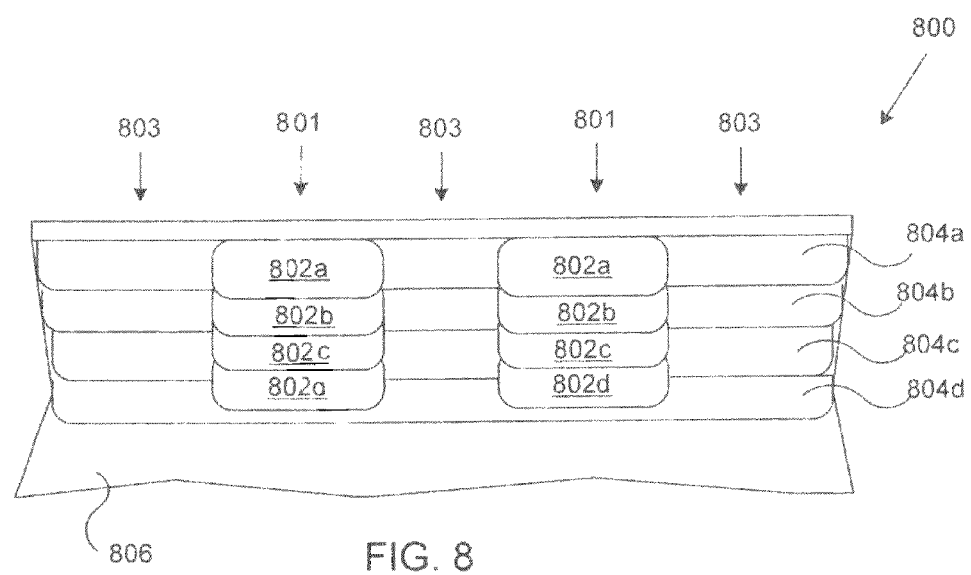
FIG. 8 is a cross-sectional view of a first image sensor in an embodiment in accordance with the invention.

FIG. 8 is a cross-sectional view of an image sensor in an embodiment in accordance with the invention. Image sensor 800 includes deep photodetectors 801 formed with diode implants 802a, 802b, 802c, 802d and deep isolation regions 803 formed with isolation layers 804a, 804b, 804c, 804d. Deep photodetectors 801 and deep isolation regions 803 are formed in substrate layer 806. Substrate layer 806 is implemented as a bulk semiconductor substrate in the embodiment shown in FIG. 8.

Substrate layer 806 and isolation layers 804a, 804b, 804c, 804d include one or more dopants of the same conductivity type, while diode implants 802a, 802b, 802c, 804d include one or more dopants of an opposite conductivity type to the conductivity type of substrate layer 806 and isolation layers 804a, 804b, 804c, 804d. In one embodiment in accordance with the invention, substrate layer 806 and isolation layers 804a, 804b, 804c, 804d include one or more dopants of the p conductivity type and diode implants 802a, 802b, 802c, 802d include one or more dopants of the n conductivity type. In another embodiment in accordance with the invention, substrate layer 806 and isolation layers 804a, 804b, 804c, 804d include one or more dopants of the n conductivity type and diode implants 802a, 802b, 802c, 802d include one or more dopants of the p conductivity type.

Figure 9:
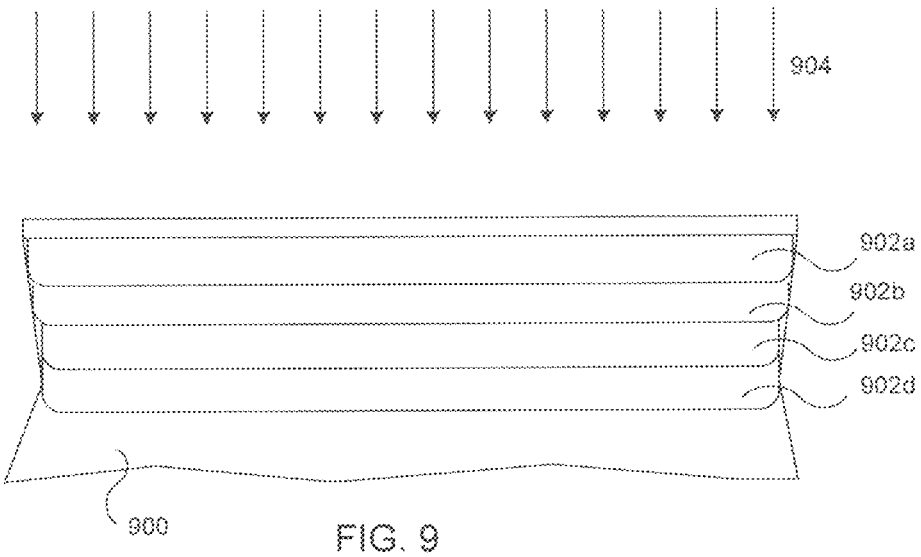
FIGS. 9-10 are cross-sectional views of a method for forming the photodetectors and isolation regions shown in FIG. 8.
Figure 10:
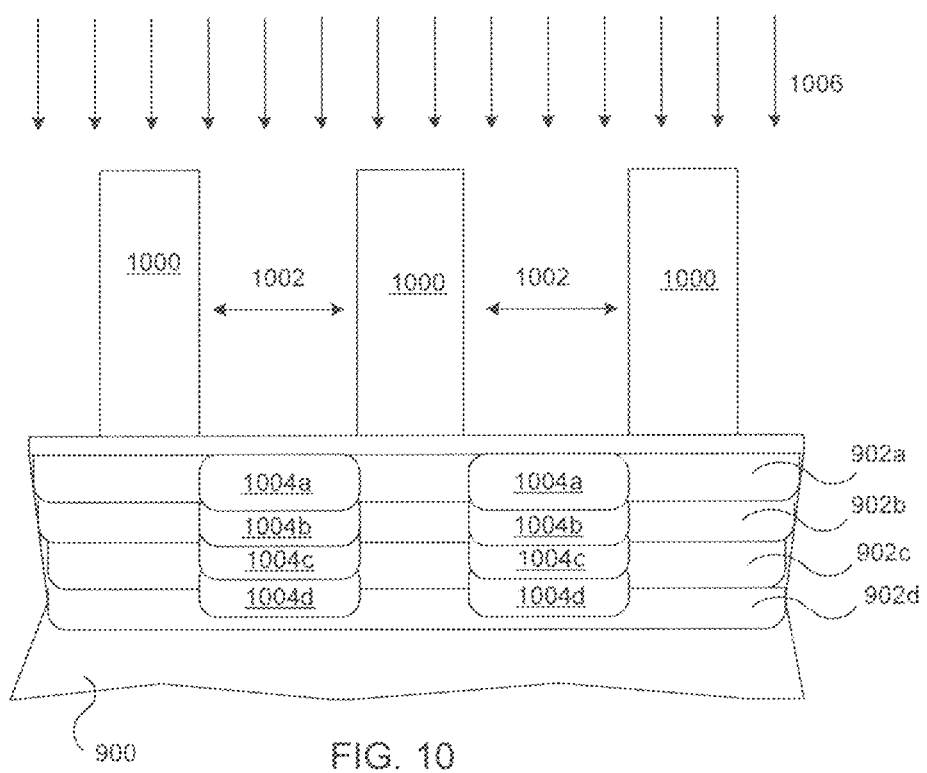

FIGS. 9-10 are cross-sectional views of a method for forming the photodetectors and isolation regions shown in FIG. 8. Typically, a masking layer, such as a photoresist, (not shown) is deposited over the substrate layer 900 and patterned to expose the entire imaging area. The masking layer may remain over other areas of an image sensor. One or more dopants are implanted into substrate layer 900 in the entire imaging area to form isolation layers 902a, 902b, 902c, 902d (see FIG. 9). Arrows 904 represent the implantation of the one or more dopants. The conductivity type of substrate layer 900 is the same type as the conductivity type of the one or more dopants that are implanted to form isolation layers 902a, 902b, 902c, 902d.

The energy used to implant the one or more dopants into substrate 900 differs for each isolation layer. The energy used to implant the dopant or dopants that form isolation layer 902d is greater than the energy used to implant the dopant or dopants that form isolation layer 902c. Similarly, the energy used to implant the one or more dopants that form isolation layer 902c is greater than the energy used to implant the dopant or dopants that form isolation layer 902b. And the energy used to implant the dopant or dopants that form isolation layer 902b is greater than the energy used to implant the one or more dopants that form isolation layer 902a.

In one embodiment in accordance with the invention, isolation layer 902d is formed first, followed by isolation layers 902c, 902b, and 902a. Thus, the implant using the highest level of energy is performed first, followed by implants using progressively less energy. In another embodiment in accordance with the invention, isolation layer 902a is formed first, followed by isolation layers 902b, 902c, and 902d. Thus, the implant using the lowest level of energy is performed first, followed by implants using progressively more energy.

Additionally, each isolation layer implant can optionally be performed with a different dopant dosage than the other isolation layer implants in the series.

At this point in the fabrication process, additional processing steps are performed after the formation of the isolation implants. The additional processing steps include, but are not limited to, the formation of dielectric layers and the formation of gate electrodes, but these steps are omitted from this description for the sake of simplicity and ease of understanding.

Next, as shown in FIG. 10, a masking layer 1000 is deposited on substrate layer 900 and patterned to form openings 1002. Masking layer 1000 is implemented as a photoresist in an embodiment in accordance with the invention. In other embodiments, masking layer 1000 is configured as a hard masking layer. Examples of materials that can be used as a hard masking layer include, but are not limited to, a metal, oxide, nitride, or polysilicon.

One or more dopants are then implanted through openings 1002 and into substrate layer 900 to form photodetectors 1004a, 1004b, 1004c, 1004d. Arrows 1006 represent the implantation of the one or more dopants. The conductivity type of diode implants 1004a, 1004b, 1004c, 1004d is opposite the conductivity type of substrate 900 and isolation layers 902a, 902b, 902c, 902d.

The energy used to implant the one or more dopants into substrate 900 differs for each diode implant. The energy used to implant the dopant or dopants that form diode implant 1004d is greater than the energy used to implant the dopant or dopants that form diode implant 1004c. Similarly, the energy used to implant the one or more dopants that form diode implant 1004c is greater than the energy used to implant the dopant or dopants that form diode implant 1004b. And the energy used to implant the dopant or dopants that form diode implant 1004b is greater than the energy used to implant the one or more dopants that form diode implant 1004a.

In one embodiment in accordance with the invention, diode implant 1004d is formed first, followed by diode implants 1004c, 1004b, 1004a. Thus, the implant using the highest level of energy is performed first, followed by implants using progressively less energy. In another embodiment in accordance with the invention, diode implant 1004a is formed first, followed by photodetectors 1004b, 1004c, 1004d. Thus, the implant using the lowest level of energy is performed first, followed by implants using progressively more energy.

Additionally, each diode implant can optionally be performed with a different dopant dosage than the other diode implants in the series.

In one embodiment in accordance with the invention, the doping level in the isolation layer implants is low compared to the doping level in the diode implants. This allows the doping level in the diode implants to overcome the doping level of the isolation layer implants such that the net doping of the diode implants has the same conductivity type as the conductivity type in the diode implants.

Figure 11:
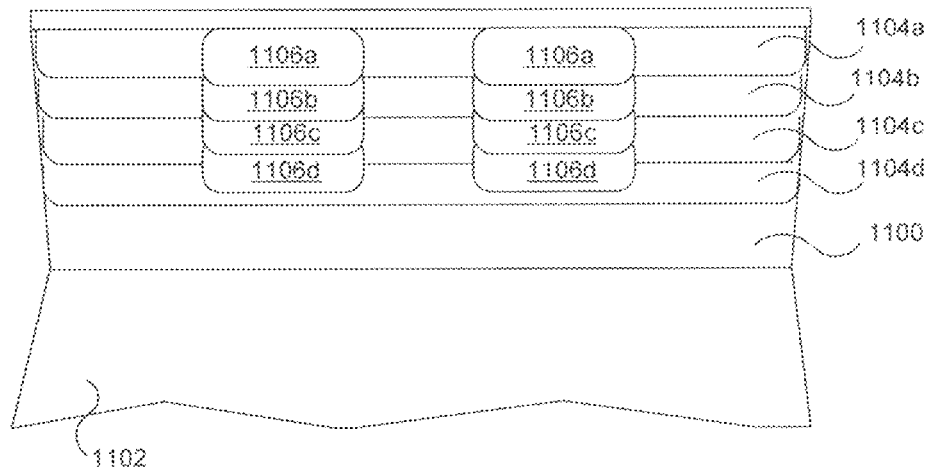
FIG. 11 is a cross-sectional view of a second image sensor in an embodiment in accordance with the invention.

FIG. 11 is a cross-sectional view of a second image sensor in an embodiment in accordance with the invention. In this embodiment, the substrate layer includes an epitaxial layer 1100 formed over (e.g., grown) substrate 1102. Epitaxial layer 1100 is formed over the entire surface of substrate 1102 in an embodiment in accordance with the invention such that epitaxial layer 1100 is laterally continuous and extends across the entire imaging area and the image sensor.

Isolation layers 1104a, 1104b, 1104c, 1104d and diode implants 1106a, 1106b, 1106c, 1106d are formed in epitaxial layer 1100 using the method shown in FIGS. 9 and 10. The conductivity type of diode implants 1106a, 1106b, 1106c, 1106d is opposite the conductivity type of isolation layers 1104a, 1104b, 1104c, 1104d and epitaxial layer 1100. Substrate 1102 can have the same or opposite conductivity type of epitaxial layer 1102.

Figure 12:
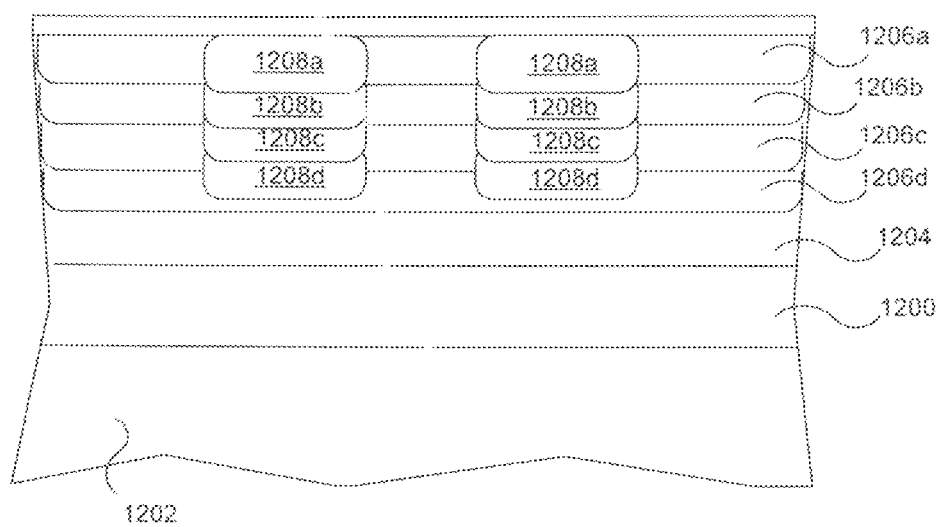
FIG. 12 is a cross-sectional view of a third image sensor in an embodiment in accordance with the invention.

Referring now to FIG. 12, there is shown a cross-sectional view of a third image sensor in an embodiment in accordance with the invention. In this embodiment, the substrate layer includes an epitaxial layer 1200 formed over substrate 1202, and a buried well 1204 formed in epitaxial layer 1200. Buried well 1204 is typically formed only in the imaging area of the image sensor. Buried well 1204 is laterally continuous and extends across the entire imaging area in an embodiment in accordance with the invention.

Isolation layers 1206a, 1206b, 1206c, 1206d and diode implants 1208a, 1208b, 1208c, 1208d are formed in buried well 1204 using the method shown in FIGS. 9 and 10. Buried well 1204 and isolation layers 1206a, 1206b, 1206c, 1206d have the same conductivity type. The conductivity type of diode implants 1208a, 1208b, 1208c, 1208d, epitaxial layer 1200, and substrate 1202 is opposite the conductivity type of isolation layers 1206a, 1206b, 1206c, 1206d and buried well 1204.

Figure 13:
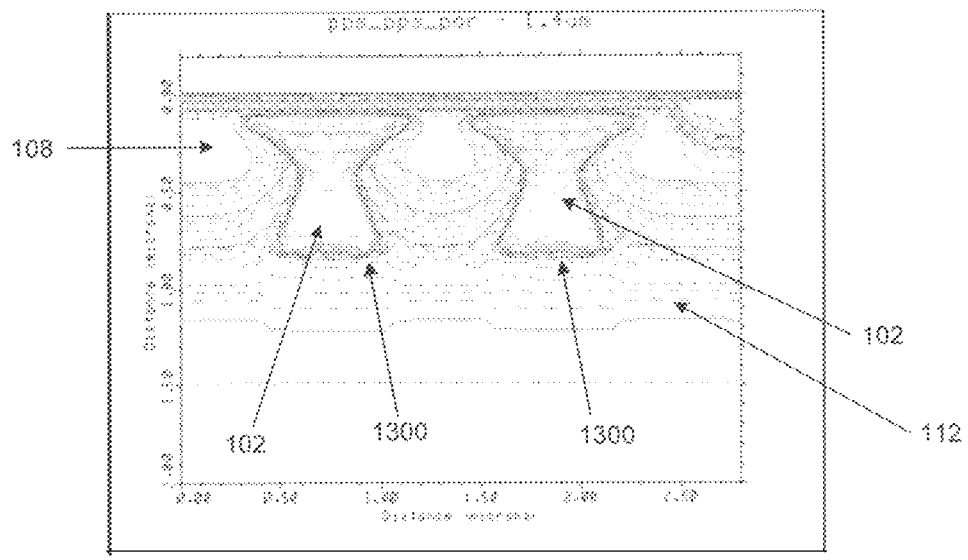
FIG. 13 is a graphical illustration of a doping contour plot for the prior art image sensor shown in FIG. 1.

FIG. 13 is a graphical illustration of a doping contour plot for the prior art image sensor shown in FIG. 1. Each pixel in the image sensor is implemented as a 1.4 micron pixel in the embodiment of FIG. 13. The metallurgical junction 1300 between photodetectors 102 and substrate 112 extends to a depth of approximately 0.8 microns for the prior art FIG. 1 structure, while isolation regions 108 extend to a depth of approximately 1.1 microns.

Figure 14:
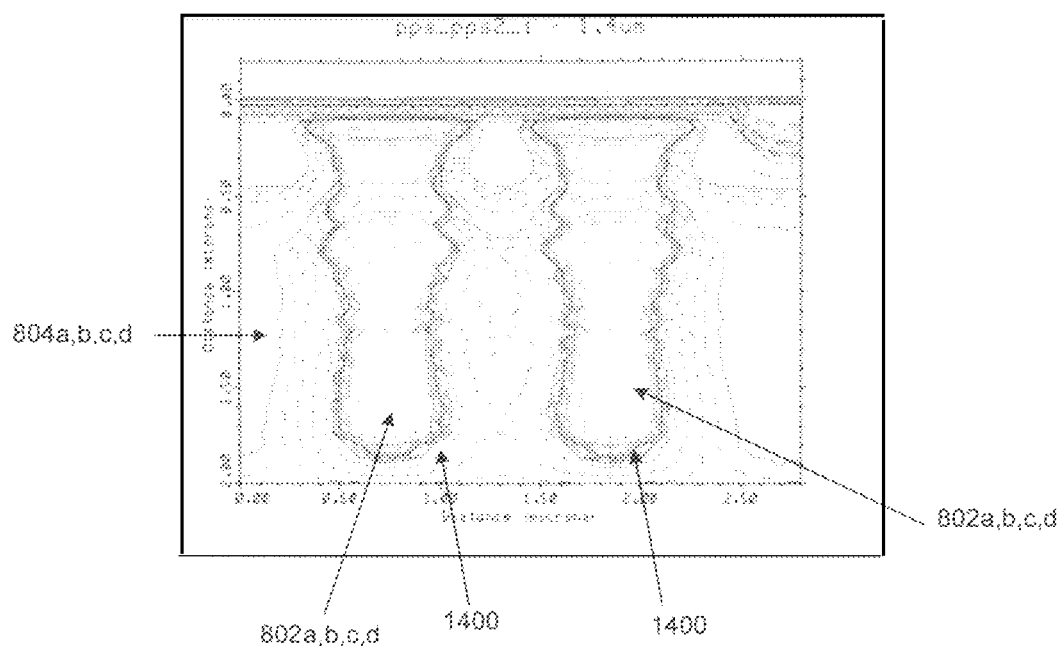
FIG. 14 is a graphical depiction of a doping contour plot for the image sensor shown in FIG. 8.

Referring now to FIG. 14, there is shown a graphical depiction of a doping contour plot for the image sensor shown in FIG. 8. Each pixel in the image sensor is implemented as a 1.4 micron pixel in the embodiment of FIG. 14. The junction 1400 between diode implants 802a, 802b, 802c, 802d and the substrate 806 (806 not shown in FIG. 14) extends to a depth of approximately 1.9 microns, while isolation layers 804a, 804b, 804c, 804d extend to a depth of approximately 1.95 microns. Diode implants 802a, 802b, 802c, 802d extend deeper into substrate 806, thereby allowing the depletion region to extend to a greater depth for photon absorption, which increases the probability for carriers generated below the depletion depth to diffuse to the photodetector depletion region.

Figure 15:
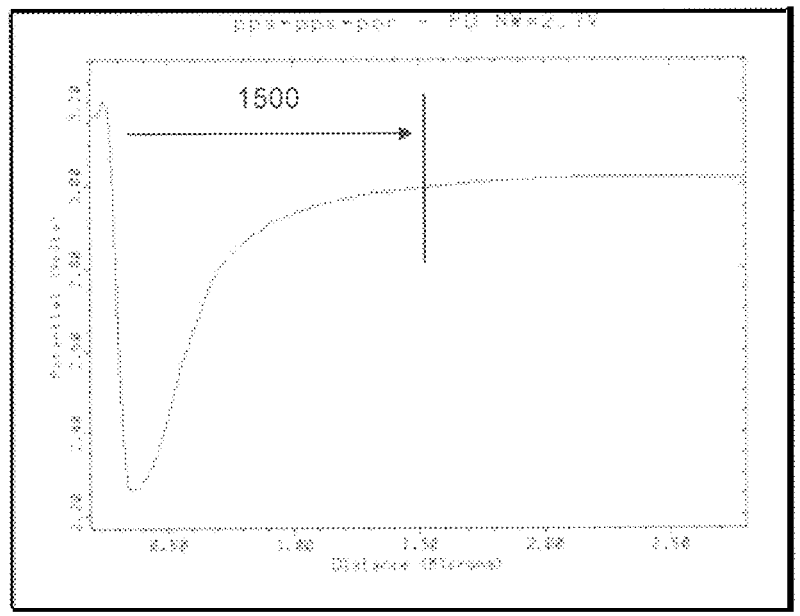
FIG. 15 is a graphical illustration of a one-dimensional electrostatic potential plot for the prior art image sensor shown in FIG. 1.

FIG. 15 is a graphical illustration of a one-dimensional electrostatic potential plot for the prior art image sensor shown in FIG. 1. FIG. 15 shows the resulting potential profile down through the center of the photodetector 102. The depletion depth 1500 in the prior art structure is around 1.5 microns.

Figure 16:
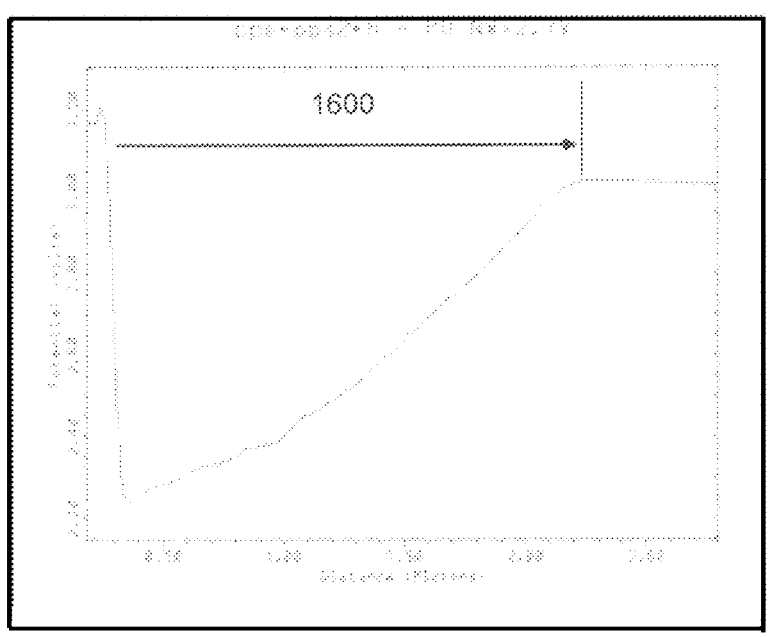
FIG. 16 is a graphical depiction of a one-dimensional electrostatic potential plot for the image sensor shown in FIG. 8.

Referring now to FIG. 16, there is shown a graphical depiction of a one-dimensional electrostatic potential plot for the image sensor shown in FIG. 8. FIG. 16 shows the resulting potential profile down through the center of the deep photodetector 801. The depletion depth 1600 extends to around 2.2 microns. The electric field disposed between 0.8 and 2.2 microns is a significant improvement over the prior art structure, as evidenced by the increased slope in the plot. This improved electric field depth increases the depletion depth, which leads to a higher probability that photons are absorbed within the depletion depth.

The invention has been described in detail with particular reference to certain preferred embodiments thereof, but it will be understood that variations and modifications can be effected within the spirit and scope of the invention. For example, the present invention can be implemented in back-illuminated image sensors. A back-illuminated image sensor typically has a thin silicon semiconductor layer (2-3 microns) in which the photodetectors reside. Providing deep photodetectors and deep isolation regions in the semiconductor layer will reduce electrical crosstalk between adjacent photodetectors.

Even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 image sensor
102 photodetector
104 pinning layer
106 photodetector
108 isolation region
110 depletion depth
112 substrate
200 image sensor
202a diode implant
202b diode implant
202c diode implant
202d diode implant
204a isolation implant
204b isolation implant
204c isolation implant
204d isolation implant
206 substrate
208 deep photodetector
210 deep isolation regions
300 pad oxide
302 masking layer
304 opening
500 masking layer
502 openings
600 image capture device
602 light
604 imaging stage
606 image sensor
608 processor
610 memory
612 display
614 other input/output
700 image sensor
701 pixel
702 pixel array
704 column decoder
706 row decoder
708 digital logic
710 multiple analog or digital output circuits
712 timing generator 800 image sensor
801 deep photodetector
802a diode implant
802b diode implant
802c diode implant
802d diode implant
803 deep isolation region
804a isolation layer
804b isolation layer
804c isolation layer
804d isolation layer
900 substrate layer
902a isolation layer
902b isolation layer
902c isolation layer
902d isolation layer
904 arrows representing series of implants
1000 masking layer
1002 openings
1004a diode implant
1004b diode implant
1004c diode implant
1004d diode implant
1006 arrows representing series of implants
1100 epitaxial layer
1102 substrate
1104a isolation layer
1104b isolation layer
1104c isolation layer
1104d isolation layer
1106a diode implant
1106b diode implant
1106c diode implant
1106d diode implant
1200 epitaxial layer
1202 substrate
1204 buried well
1206a isolation layer
1206b isolation layer
1206c isolation layer
1206d isolation layer
1208a diode implant
1208b diode implant
1208c diode implant
1208d diode implant
1300 junction
1400 junction
1500 depletion depth
1600 depletion depth

The invention claimed is:

1. A method for fabricating isolation regions and photodetectors in an image sensor, wherein the image sensor comprises an imaging area that includes a substrate layer having a plurality of pixels formed therein, and each pixel includes a photodetector formed in the substrate layer, the method comprising:

forming isolation layers in the substrate layer by performing a series of implants of one or more dopants of a first conductivity type into the substrate layer, wherein each isolation layer implant is performed with a different energy than the other isolation layer implants in the series and each implant spans the entire imaging area; and forming the photodetectors in the substrate layer by performing a series of implants of one or more dopants of a second conductivity type into each pixel in the substrate layer, wherein each photodetector implant is performed with a different energy than the other photodetector implants in the series.

2. The method as in claim 1, wherein each isolation layer implant in the series of isolation layer implants is performed with a different energy and a different dopant dosage than the other isolation layer implants in the series.

3. The method as in claim 1, wherein the series of isolation layer implants begins with highest energy implant and each subsequent implant is performed with progressively lower energy.

4. The method as in claim 1, wherein the series of isolation layer implants begins with lowest energy implant and each subsequent implant is performed with progressively higher energy.

5. The method as in claim 1, wherein each photodetector implant in the series of photodetector implants is performed with a different energy and a different dopant dosage than the other photodetector implants in the series.

6. The method as in claim 1, wherein the series of photodetector implants begins with highest energy implant and each subsequent implant is performed with progressively lower energy.

7. The method as in claim 1, wherein the series of photodetector implants begins with lowest energy implant and each subsequent implant is performed with progressively higher energy.

8. The method as in claim 1, further comprising depositing and patterning a resist prior to performing the series of photodetector implants.

9. The method as in claim 1, further comprising depositing a resist over the image sensor and patterning the resist to remove the resist from the imaging area prior to performing the series of isolation layer implants.

10. The method as in claim 1, wherein the dopants of the second conductivity type compensate the dopants of the first conductivity type in each unmasked region of each pixel.

* * * * *